(12) United States Patent
Uchida et al.

(10) Patent No.: US 11,268,803 B2
(45) Date of Patent: Mar. 8, 2022

(54) POSITION DETECTION DEVICE

(71) Applicant: DENSO CORPORATION, Kariya (JP)

(72) Inventors: Takuma Uchida, Kariya (JP); Yoshiyuki Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/263,148

(22) Filed: Jan. 31, 2019

(65) Prior Publication Data

US 2019/0162518 A1    May 30, 2019

Related U.S. Application Data

(63) Continuation of application No. PCT/JP2017/029298, filed on Aug. 14, 2017.

(30) Foreign Application Priority Data

Aug. 14, 2017  (JP) .............................. JP2016-162958

(51) Int. Cl.
*G01B 7/30* (2006.01)
*G01D 5/14* (2006.01)
*G01D 11/24* (2006.01)
*G01D 5/12* (2006.01)

(52) U.S. Cl.
CPC .................. *G01B 7/30* (2013.01); *G01D 5/12* (2013.01); *G01D 5/145* (2013.01); *G01D 11/245* (2013.01)

(58) Field of Classification Search
CPC ............ G01D 5/12; G01D 5/16; G01D 5/142; G01D 5/147; G01D 11/30; G01D 11/245; G01B 7/30
See application file for complete search history.

(56) References Cited

U.S. PATENT DOCUMENTS

| | | | | |
|---|---|---|---|---|
| 6,756,780 B2* | 6/2004 | Hagio | ................. | G01D 11/30 324/207.25 |
| 8,981,769 B2* | 3/2015 | Ikeda | ................. | G01B 7/30 324/207.25 |
| 9,103,647 B2* | 8/2015 | Takiguchi | ............. | G01D 5/145 |
| 2007/0000455 A1 | 1/2007 | Akiyama et al. | | |
| 2015/0177025 A1* | 6/2015 | Mizunuma | ........... | G01D 11/245 324/207.25 |
| 2015/0345994 A1 | 12/2015 | Mase | | |
| 2016/0265946 A1 | 9/2016 | Mase | | |

FOREIGN PATENT DOCUMENTS

JP          2004-226091          8/2004

* cited by examiner

*Primary Examiner* — Patrick Assouad
*Assistant Examiner* — Haidong Zhang
(74) *Attorney, Agent, or Firm* — Nixon & Vanderhye P.C.

(57) ABSTRACT

The present disclosure provides a position detection device including an IC package, a terminal line and a sensor housing. The IC package includes a magnetic detection element, a sealing portion sealing the magnetic detection element, and a lead line protruding from the sealing portion and electrically connected to the magnetic detection element. The lead line is fixed to the terminal line. The sensor housing is formed separately from the IC package and supports the terminal line.

21 Claims, 6 Drawing Sheets

POSITION DETECTION DEVICE

CROSS REFERENCE TO RELATED APPLICATIONS

The present application is a continuation application of International Patent Application No. PCT/JP2017/029298 filed on Aug. 14, 2017, which designated the U.S. and claims the benefit of priority from Japanese Patent Application No. 2016-162958 filed on Aug. 23, 2016. The entire disclosures of all of the above applications are incorporated herein by reference.

TECHNICAL FIELD

The present disclosure relates to a position detection device.

BACKGROUND

A position detection device detects a position of a detection target, which moves relative to a reference member, by a magnetic flux generating member such as a magnet.

SUMMARY

The present disclosure provides a position detection device including an IC package, a terminal line and a sensor housing. The IC package includes a magnetic detection element, a sealing portion sealing the magnetic detection element, and a lead line protruding from the sealing portion and electrically connected to the magnetic detection element. The lead line is fixed to the terminal line. The sensor housing is formed separately from the IC package and supports the terminal line.

BRIEF DESCRIPTION OF THE DRAWINGS

The above and other objects, features and advantages of the present disclosure will become more apparent from the following detailed description made with reference to the accompanying drawings, in which.

DETAILED DESCRIPTION

Figure 1:
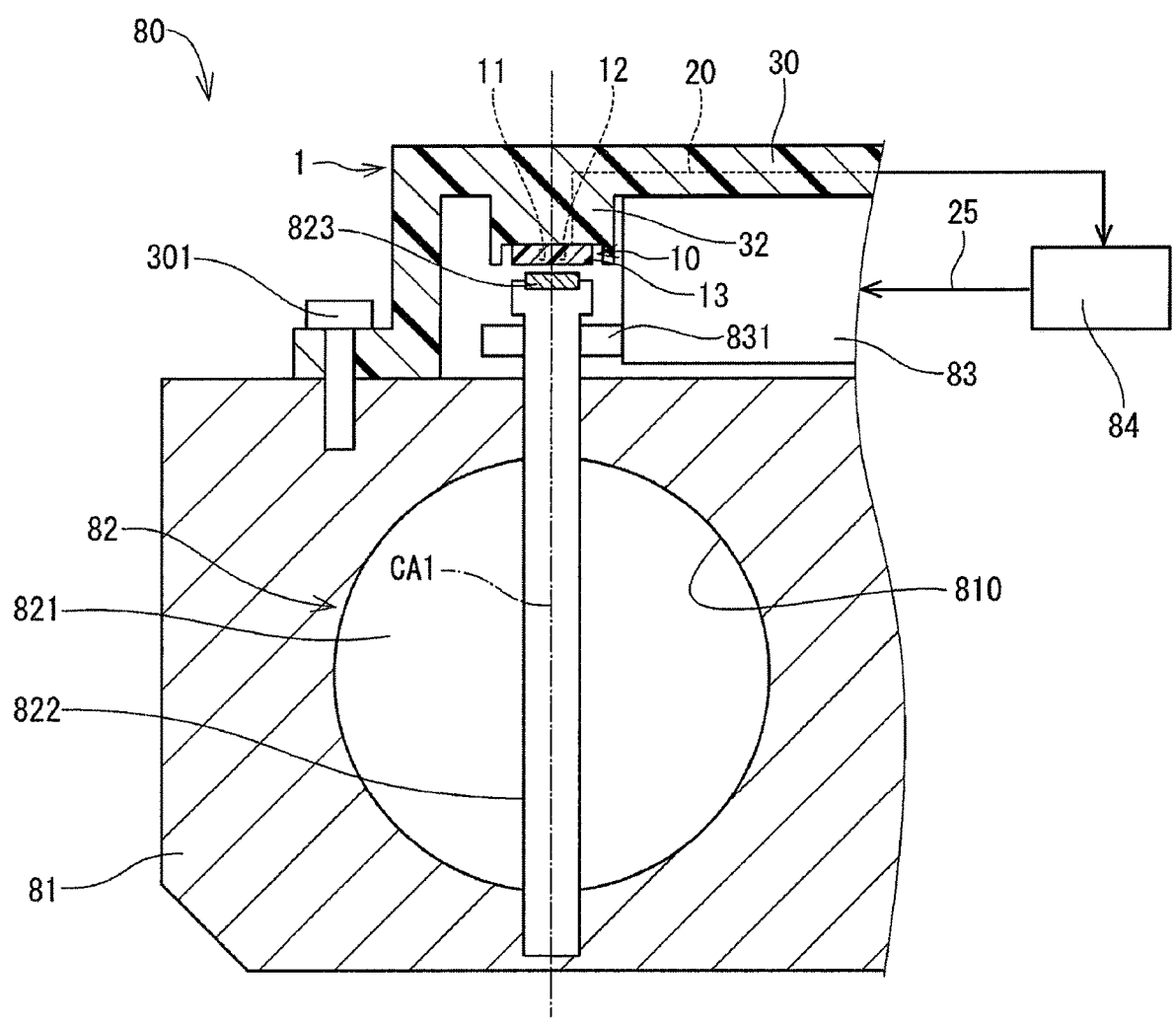
FIG. 1 is a schematic diagram of an electronically controlled throttle device to which a position detection device according to a first embodiment of the present disclosure is applied.

For example, a position detection device may include an IC package having two magnetic detection elements capable of detecting a change in magnetic field due to rotation of a detection target, a sensor terminal electrically connectable to the IC package, and a sensor housing having a connector portion capable of assembling an external terminal electrically connectable to the sensor terminal.

In this position detection device, the IC package is provided on a predetermined installation surface of the sensor housing. The lead line included in the IC package is electrically connected to the sensor terminal inserted in the sensor housing. However, the lead line needs to be deformed in order to fix the lead line and the sensor terminal in a state where the IC package is provided on a predetermined installation surface of the sensor housing so as not to be able to move relative to each other. If the lead line is deformed, a load is applied to the IC package, as a result that the IC package may be broken such that bonding in the IC package may be disconnected.

Hereinafter, a plurality of embodiments of the present disclosure will be described with reference to the drawings. In the embodiments, substantially the same parts will be given the same reference numerals and descriptions thereof will be omitted.

First Embodiment

A position detection device according to a first embodiment will be described with reference to FIGS. 1, 2, 3A and 3B. A rotation angle detection device 1 as the "position detection device" according to the first embodiment is used for an electronically controlled throttle device 80 which controls an air intake amount to an engine mounted on a vehicle not shown.

First, a configuration of the electronically controlled throttle device 80 will be described. As shown in FIG. 1, the electronically controlled throttle device 80 includes a valve housing 81, a throttle valve 82, a motor 83, a rotation angle detection device 1, an electronic control unit (hereinafter referred to as "ECU") 84, and the like.

The valve housing 81 has an intake air passage 810 for introducing an air into the engine. The throttle valve 82 is provided in the intake air passage 810.

The throttle valve 82 has a valve member 821 as a "detection target" and a valve shaft 822. The valve member 821 is a substantially disk-shaped member having an outer diameter slightly smaller than an inner diameter of the intake air passage 810. The valve member 821 is fixed to the valve shaft 822.

Both sides of the valve shaft 822 are rotatably journaled in the valve housing 81. As a result, the valve member 821 can rotate about a rotation axis CA1 of the valve shaft 822 as a rotation axis. A magnet 823 is provided at an end portion of the valve shaft 822 on a side of the rotation angle detection device 1. When the valve shaft 822 rotates, a magnetic field in the vicinity of an IC package 10 included in the rotation angle detection device 1 changes.

The motor 83 is accommodated in the rotation angle detection device 1. The motor 83 is connected to the valve shaft 822 through a coupling member 831. The motor 83 generates a rotational torque capable of rotating the valve shaft 822. The motor 83 is electrically connected to the ECU 84.

The ECU 84 is a small-sized computer having a CPU as an arithmetic unit, a ROM and a RAM as a storage unit, an input/output unit, and the like. The ECU 84 determines the opening degree of the throttle valve 82 in accordance with a traveling status of the vehicle on which the electronically controlled throttle device 80 is mounted and an operating status of a driver of the vehicle. The ECU 84 outputs an electric power corresponding to the opening degree of the throttle valve 82 to the motor 83. As a result, the opening degree of the throttle valve 82 is controlled to adjust the air intake amount supplied to the engine.

Figure 2:
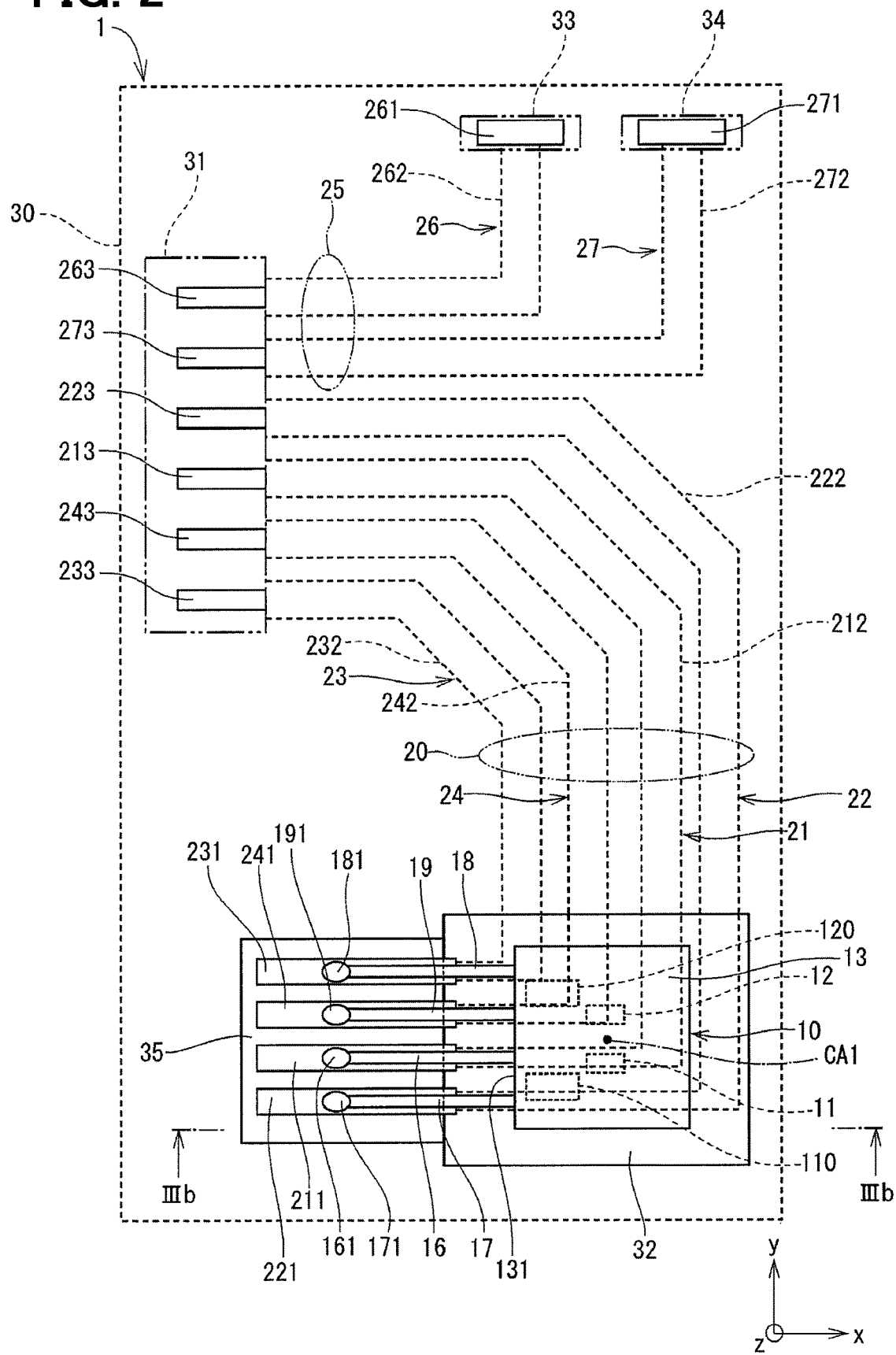
FIG. 2 is a schematic diagram of a position detection device according to a first embodiment of the present disclosure.

The rotation angle detection device 1 includes the IC package 10, a sensor terminal 20, a motor terminal 25, and a sensor housing 30. The rotation angle detection device 1 is provided in the valve housing 81 on an end portion side where the magnet 823 of the valve shaft 822 is provided. In FIG. 2, the sensor housing 30 is indicated by a dotted line, and shapes and placements of the IC package 10, the sensor terminal 20, and the motor terminal 25 are schematically shown.

The IC package 10 is an IC package of a type called a two-system output type or a two-output type. The IC package 10 includes a first magnetic detection element 11, a first signal processing circuit 110, a second magnetic detection element 12, a second signal processing circuit 120, a power supply lead line 16 as a "lead line", a first signal lead line 17 as a "lead line", a second signal lead line 18 as a "lead line", and a ground lead line 19 as a "lead line". As shown in FIG. 1, the IC package 10 is provided in the vicinity of the magnet 823 on the rotation axis CA 1.

The first magnetic detection element 11 can output a first signal corresponding to a first component of a magnetic field developed by the magnet 823 or an intensity of the first component. The first magnetic detection element 11 is electrically connected to the power supply lead line 16, the ground lead line 19, and the first signal processing circuit 110.

The first signal processing circuit 110 is electrically connected to the first signal lead line 17. The first signal processing circuit 110 processes the first signal output from the first magnetic detection element 11.

The second magnetic detection element 12 can output a second signal corresponding to a second component different from the first component of the magnetic field developed by the magnet 823 or an intensity of the second component. The second magnetic detection element 12 is electrically connected to the power supply lead line 16, the ground lead line 19, and the second signal processing circuit 120.

The second signal processing circuit 120 is electrically connected to the second signal lead line 18. The second signal processing circuit 120 processes the second signal output from the second magnetic detection element 12.

A sealing portion 13 is configured to seal the first magnetic detection element 11, the first signal processing circuit 110, the second magnetic detection element 12, and the second signal processing circuit 120, and is formed in a substantially rectangular parallelepiped shape.

The power supply lead line 16 is formed so as to project from an end face 131 of the sealing portion 13 in a direction substantially perpendicular to the rotation axis CA1. In the power supply lead line 16, a current flows from a power supply (not shown) toward the first magnetic detection element 11 and the second magnetic detection element 12.

In this example, in order to described shapes and placements of the IC package 10, the sensor terminal 20, and the motor terminal 25 for convenience, a coordinate plane is set in FIG. 2. An axis parallel to a direction in which the power supply lead line 16 protrudes is defined as an x-axis, and a direction in which the power supply lead line 16 protrudes is defined as a negative direction of the x-axis. That is, the power supply lead line 16 protrudes from the end face 131 in the negative direction of the x-axis. An axis perpendicular to the x-axis and perpendicular to the rotation axis CA1 is defined as a y-axis. An axis perpendicular to the x-axis and the y-axis is defined as a z-axis.

The first signal lead line 17 is formed so as to project from the end face 131 of the sealing portion 13 in the negative direction of the x-axis. The first signal lead line 17 can output the first signal output from the first signal processing circuit 110 to an outside.

The second signal lead line 18 is formed so as to project from the end face 131 of the sealing portion 13 in the negative direction of the x-axis. The second signal lead line 18 can output the second signal output from the second signal processing circuit 120 to the outside.

The ground lead line 19 is formed so as to project from the end face 131 of the sealing portion 13 in the negative direction of the x-axis. The ground lead line 19 causes a current flowing through the first magnetic detection element 11 and the second magnetic detection element 12 to flow to the ground.

In the IC package 10 according to the first embodiment, as shown in FIG. 2, the first signal lead line 17, the power supply lead line 16, the ground lead line 19, and the second signal lead line 18 are aligned so as to project in the negative direction of the x-axis in the stated order on the end face 131.

The sensor terminal 20 includes a power supply terminal line 21 as a "terminal line", a first signal terminal line 22 as a "terminal line", a second signal terminal line 23 as a "terminal line", and a ground terminal line 24 as a "terminal line". The sensor terminal 20 is a member having a relatively high conductivity, which is formed to extend from the vicinity of the power supply lead line 16 or the like through a side of the IC package 10 opposite to the magnet 823, to a connector portion 31 of the sensor housing 30. The sensor terminal 20 is integrated with the sensor housing 30 by insert molding of the sensor housing 30.

The power supply terminal line 21 includes a power supply welding terminal 211, a power supply insertion portion 212, and a power supply connector terminal 213.

The power supply welding terminal 211 is provided on a mounting surface 351 of a placement table 35 provided in the sensor housing 30. The power supply welding terminal 211 is formed to extend in the positive direction of the x-axis from an end of the power supply terminal line 21. The power supply welding terminal 211 can be welded to the power supply lead line 16. A side of the power supply welding terminal 211 opposite to the end of the power supply terminal line 21 is connected to the power supply insertion portion 212.

The power supply insert portion 212 is inserted into the sensor housing 30. The power supply insertion portion 212 is formed to pass through a side of the IC package 10 opposite to the magnet 823, extend in the positive direction of the y-axis and then extend in the negative direction of the x-axis. A side of the power supply insert portion 212 opposite to the side connected to the power supply welding terminal 211 is connected to the power supply connector terminal 213.

The power supply connector terminal 213 is located in the connector portion 31. The power supply connector terminal 213 is formed so as to be electrically connectable to a power source (not shown) through an external connector (not shown). In the power supply terminal line 21, a current flows from the power supply to the first magnetic detection element 11 and the second magnetic detection element 12.

The first signal terminal line 22 includes a first signal welding terminal 221, a first signal insertion portion 222, and a first signal connector terminal 223.

The first signal welding terminal 221 is provided on the mounting surface 351 of the placement table 35 of the sensor housing 30. The first signal welding terminal 221 is formed to extend in the positive direction of the x-axis from the end of the first signal terminal line 22. The first signal welding terminal 221 can be welded to the first signal lead line 17. A portion of the first signal welding terminal 221 opposite to the end of the first signal terminal line 22 is connected to the first signal insertion portion 222.

The first signal insertion portion 222 is inserted into the sensor housing 30. The first signal insertion portion 222 is formed so as to pass through a side of the IC package 10 opposite to the magnet 823, extend in the positive direction of the y-axis, and then extend in the negative direction of the x-axis. A side of the first signal insertion portion 222 opposite to the side connected to the first signal welding terminal 221 is connected to the first signal connector terminal 223.

The first signal connector terminal 223 is located in the connector portion 31. The first signal connector terminal 223 is formed to be electrically connectable to the ECU 84 through an external connector. The first signal terminal line 22 outputs the first signal output from the first signal processing circuit 110 to the ECU 84.

The second signal terminal line 23 includes a second signal welding terminal 231, a second signal insertion portion 232, and a second signal connector terminal 233.

The second signal welding terminal 231 is provided on the mounting surface 351 of the placement table 35 of the sensor housing 30. The second signal welding terminal 231 is formed so as to extend in the positive direction of the x-axis from the end of the second signal terminal line 23. The second signal welding terminal 231 can be welded to the second signal lead line 18. A side of the second signal welding terminal 231 opposite to the end of the second signal terminal line 23 is connected to the second signal insertion portion 232.

The second signal insertion portion 232 is inserted into the sensor housing 30. The second signal insertion portion 232 is formed so as to pass through the side of the IC package 10 opposite to the magnet 823, extend in the positive direction of the y-axis, and then extend in the negative direction of the x-axis. A side of the second signal insertion portion 232 opposite to the side connected to the second signal welding terminal 231 is connected to the second signal connector terminal 233.

The second signal connector terminal 233 is located in the connector portion 31. The second signal connector terminal 233 is formed to be electrically connectable to the ECU 84 through an external connector. The second signal terminal line 23 outputs the second signal output from the second signal processing circuit 120 to the ECU 84.

The ground terminal line 24 includes a ground welding terminal 241, a ground insertion portion 242, and a ground connector terminal 243.

The ground welding terminal 241 is provided on the mounting surface 351 of the placement table 35 of the sensor housing 30. The ground welding terminal 241 is formed to extend in the positive direction of the x-axis from the end of the ground terminal line 24. The ground welding terminal 241 can be welded to the ground lead line 19. A side of the ground welding terminal 241 opposite to the end of the ground terminal line 24 is connected to the ground insertion portion 242.

The ground insertion portion 242 is inserted into the sensor housing 30. The ground insertion portion 242 is formed so as to pass through a side of the IC package 10 opposite to the magnet 823, extend in the positive direction of the y-axis and then extend in the negative direction of the x-axis. A side of the ground insertion portion 242 opposite to the side connected to the ground welding terminal 241 is connected to the ground connector terminal 243.

The ground connector terminal 243 is located in the connector portion 31. The ground connector terminal 243 is formed to be electrically connectable to the ground through an external connector. The ground terminal line 24 causes a current flowing through the first magnetic detection element 11 and the second magnetic detection element 12 to flow to the ground.

The motor terminal 25 has two motor terminal lines 26 and 27. Each of the two motor terminal lines 26 and 27 includes motor connection terminals 261 and 271, motor insertion portions 262 and 272, and motor connector terminals 263 and 273.

The motor connection terminals 261 and 271 are provided in sockets 33 and 34 of the sensor housing 30, respectively. The sockets 33 and 34 are formed so as to be engageable with the motor 83. As a result, the motor connection terminals 261 and 271 can be connected to external terminals (not shown) of the motor 83. The motor connection terminals 261 and 271 are connected to the motor insertion portions 262 and 272, respectively.

The motor insertion portions 262 and 272 are inserted into the sensor housing 30. The end portions of the motor insertion portions 262 and 272 opposite to the ends connected to the motor connection terminals 261 and 271 are connected to the motor connector terminals 263 and 273, respectively. The motor connector terminals 263 and 273 are located in the connector portion 31. The motor terminal 25 can supply an electric power supplied by a power supply to the motor 83 through the connector portion 31.

Figure 3A:
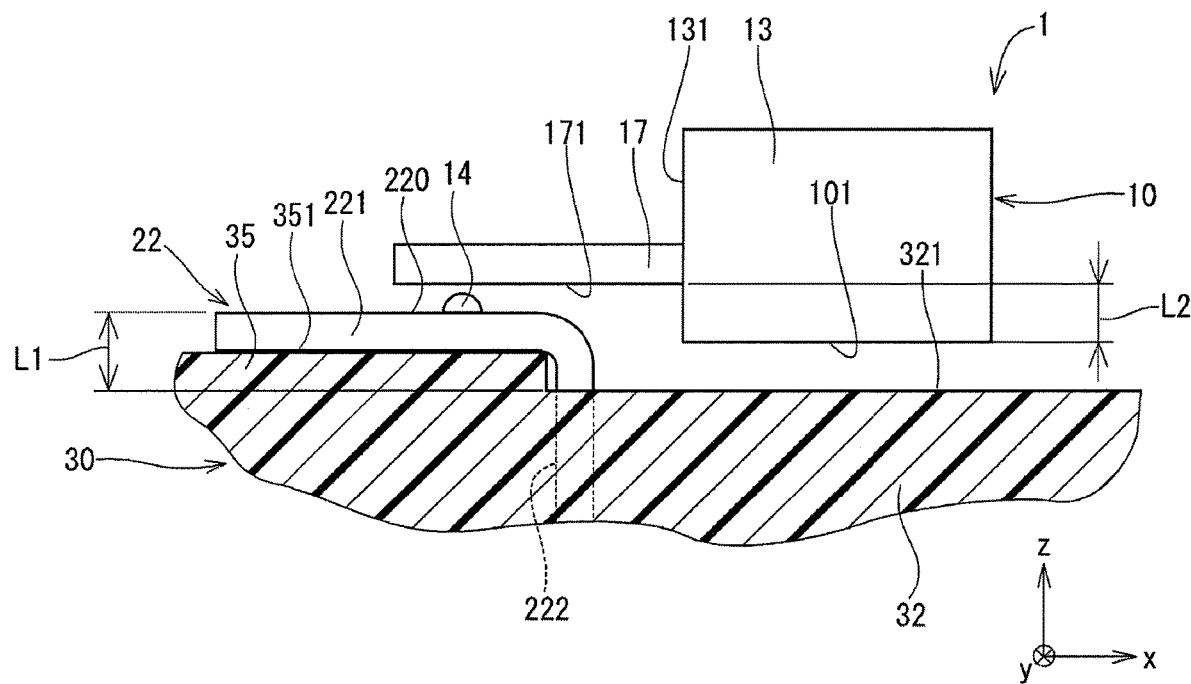
FIG. 3A is a cross-sectional view showing a state before a first signal lead line and a first signal terminal line are welded to each other.
Figure 3B:
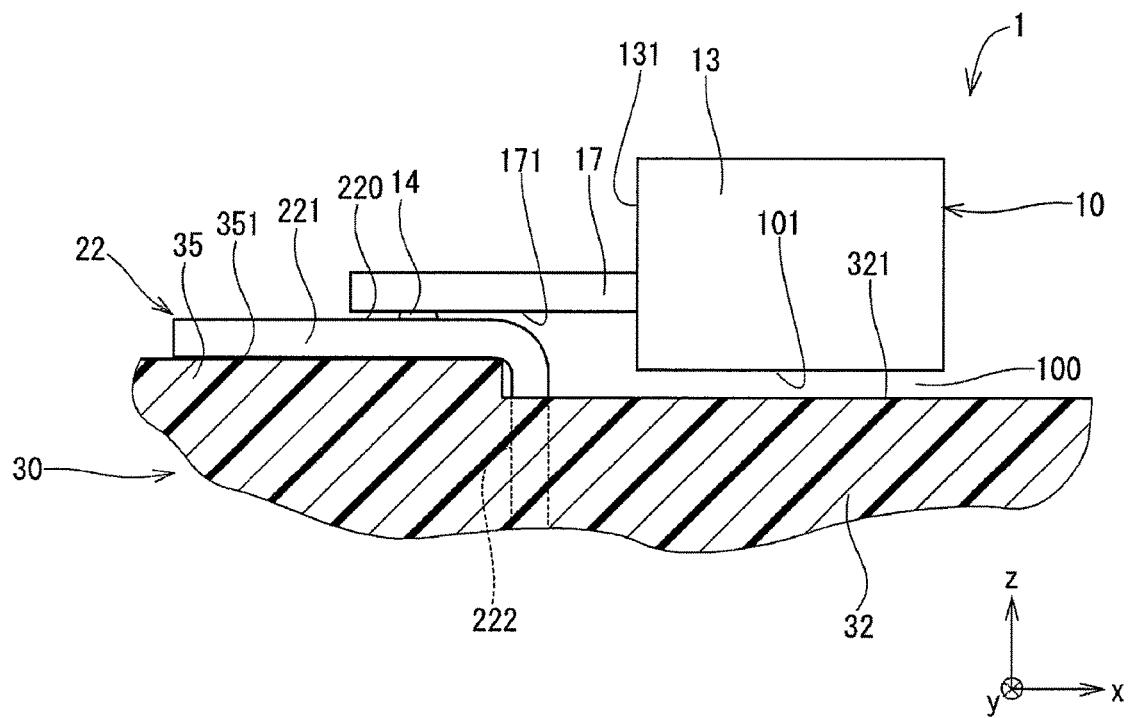
FIG. 3B is a cross-sectional view taken along a line IIIb-IIIb of FIG. 2, showing a state after the first signal lead line and the first signal terminal line have been welded to each other.

The sensor housing 30 is a hollow member formed in a substantially rectangular parallelepiped shape. As shown in FIG. 1, the sensor housing 30 has an opening on the valve housing 81 side, and is formed so as to accommodate the motor 83 inside. The sensor housing 30 is fixed to the valve housing 81 by a bolt 301 in a relatively immovable manner. The sensor housing 30 has a stage 32 on which the IC package 10 can be mounted. As a result, as shown in FIG. 1, the IC package 10 is provided in the vicinity of the magnet 823. A part of the sensor terminal 20 is inserted into the stage 32. Next, features of the rotation angle detection device 1 according to the first embodiment will be described with reference to FIGS. 3A and 3B. FIG. 3A shows a state before the first signal lead line 17 and the first signal terminal line 22 are welded to each other. FIG. 3B is a cross-sectional view taken along a line IIIb-IIIb of FIG. 2, showing a state after the first signal lead line 17 and the first signal terminal lines 22 have been welded to each other.

Figure 6A:
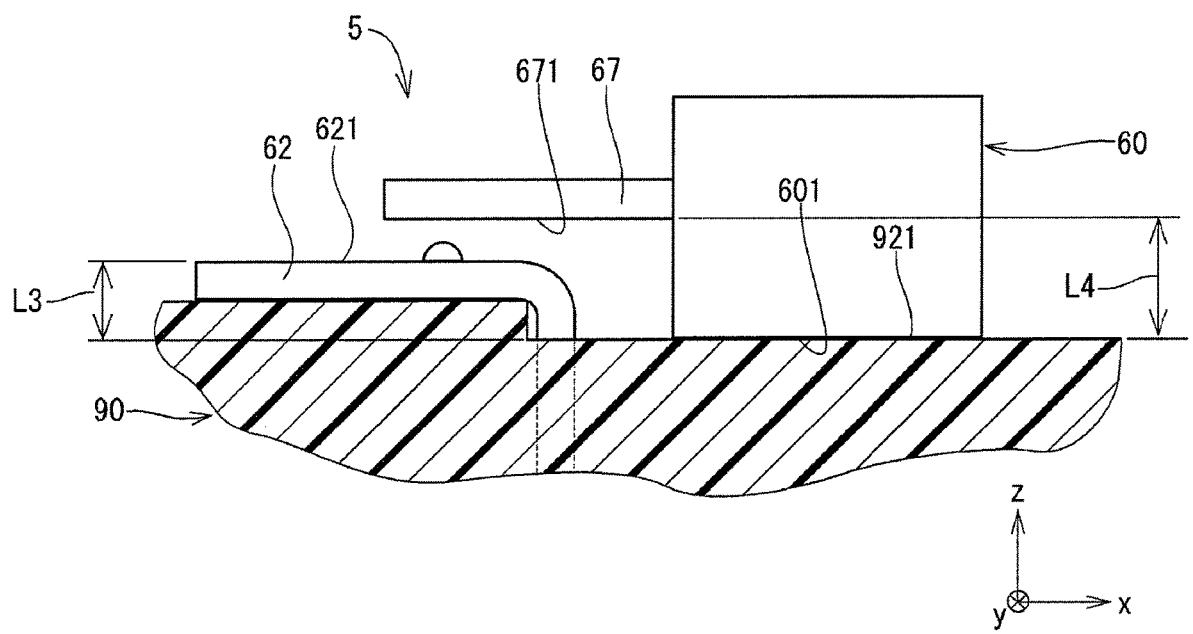
FIG. 6A is a partial enlarged view of the position detection device of the comparative example, showing a state before the first signal lead line and the first signal terminal line are welded to each other.
Figure 6B:
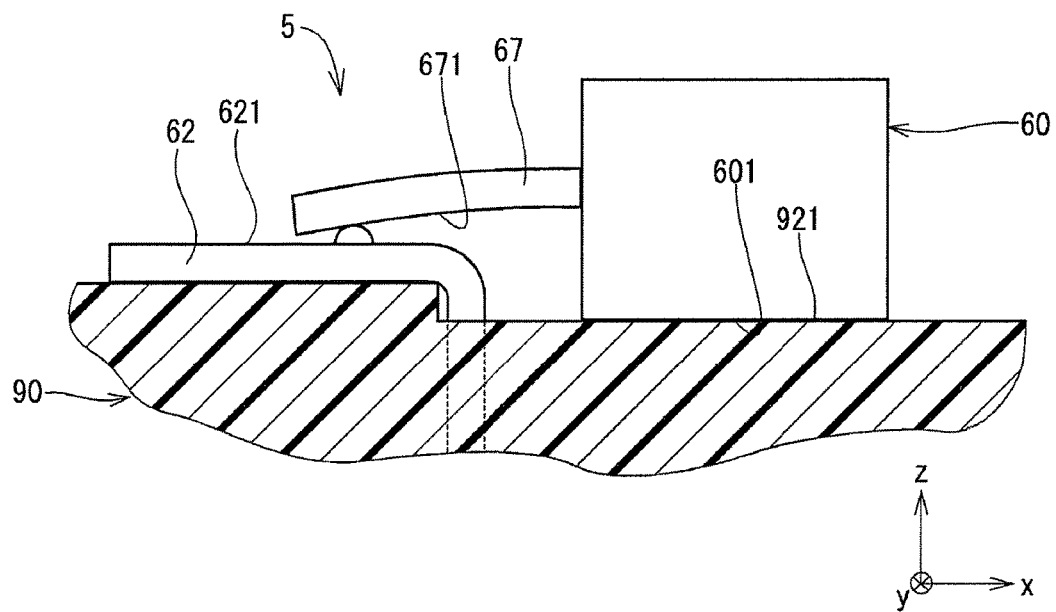
FIG. 6B is a partially enlarged view of a position detection device in a comparative example, showing a state after a first signal lead line and a first signal terminal line have been welded to each other.

FIGS. 6A and 6B show partial cross-sectional views of the rotation angle detection device 5 in a comparative example. FIG. 6A shows a state before the first signal lead line 67 and the first signal terminal line 62 included in the rotation angle detection device 5 are welded to each other. FIG. 6B shows a state after the first signal lead line 67 and the first signal terminal line 62 have been welded to each other.

Now, features of the rotation angle detection device 5 in the comparative example will be described.

As shown in FIG. 6A, a distance from a package installation surface 921 of the sensor housing 90 on which the IC package 60 is installed to an end face 621 of the first signal terminal line 62 which can be in contact with the first signal lead line 67 is defined as a distance L3. On the other hand, a distance from an end face 671 of the first signal lead line 67 that can be in contact with the first signal terminal line 62 to an opposing surface 601 facing the package installation surface 921 of the IC package 60 is defined as a distance L4.

In the rotation angle detection device 5 of the comparative example, the distance L3 is shorter than the distance L4. For that reason, when the first signal lead line 67 and the first signal terminal line 62 are welded to each other in the rotation angle detection device 5, the first signal lead line 67 needs to be deformed as shown in FIG. 6B. The deformation of the first signal lead line 67 applies a load to the IC package 60, which may lead to breakage of the IC package 60 such as breakage of bonding in the IC package 60.

On the other hand, in the rotation angle detection device 1, a distance from the package installation surface 321 of the sensor housing 30 on which the IC package 10 is provided to an end face 220 of the first signal welding terminal 221 in the first signal terminal line 22 which can be in contact with the first signal lead line 17 is defined as a distance L1 (refer to FIG. 3A). On the other hand, a distance from the end face 171 of the first signal lead line 17 which can be in contact with the first signal terminal line 22 to the opposing surface 101 that faces the package installation surface 321 of the IC package 10 is defined as a distance L2 (refer to FIG. 3A). In this case, the distance L1 is longer than the distance L2.

In the first embodiment, a projection 14 is provided on the first signal lead line 17 side of the first signal terminal line 22, but the height of the projection 14 is not included in the distance L1. In this example, the distances L1 and L2 are defined based on the first signal lead line 17 and the first signal terminal line 22, but the same applies to the power supply lead line 16 and the power supply terminal line 21, the ground lead line 19 and the ground terminal line 24, and the second signal lead line 18 and the second signal terminal line 23.

When the lead lines 16, 17, 18, and 19 and the terminal lines 21, 22, 23, and 24 are welded to each other in a relationship of the distance between the IC package 10 and the sensor housing 30 as described above, even if the end face 171 of the first signal lead line 17 and the end face 220 of the first signal terminal line 22 come into contact with each other, as shown in FIG. 3B, a gap 100 is provided between the package installation surface 321 and the opposing surface 101.

In the rotation angle detection device 1 according to the first embodiment, the IC package 10 and the sensor housing 30 are formed so that the distance L1 is longer than the distance L2. As a result, the lead lines 16, 17, 18, and 19 can be welded to the terminal lines 21, 22, 23, and 24 without deforming the lead lines 16, 17, 18, and 19, and the IC package 10 is not loaded by the deformation of the lead lines 16, 17, 18, and 19. Therefore, according to the first embodiment, the IC package 10 can be prevented from being damaged.

Second Embodiment

A position detection device according to a second embodiment will be described with reference to FIG. 4. The second embodiment is different from the first embodiment in that a vibration reduction member is provided.

Figure 4:
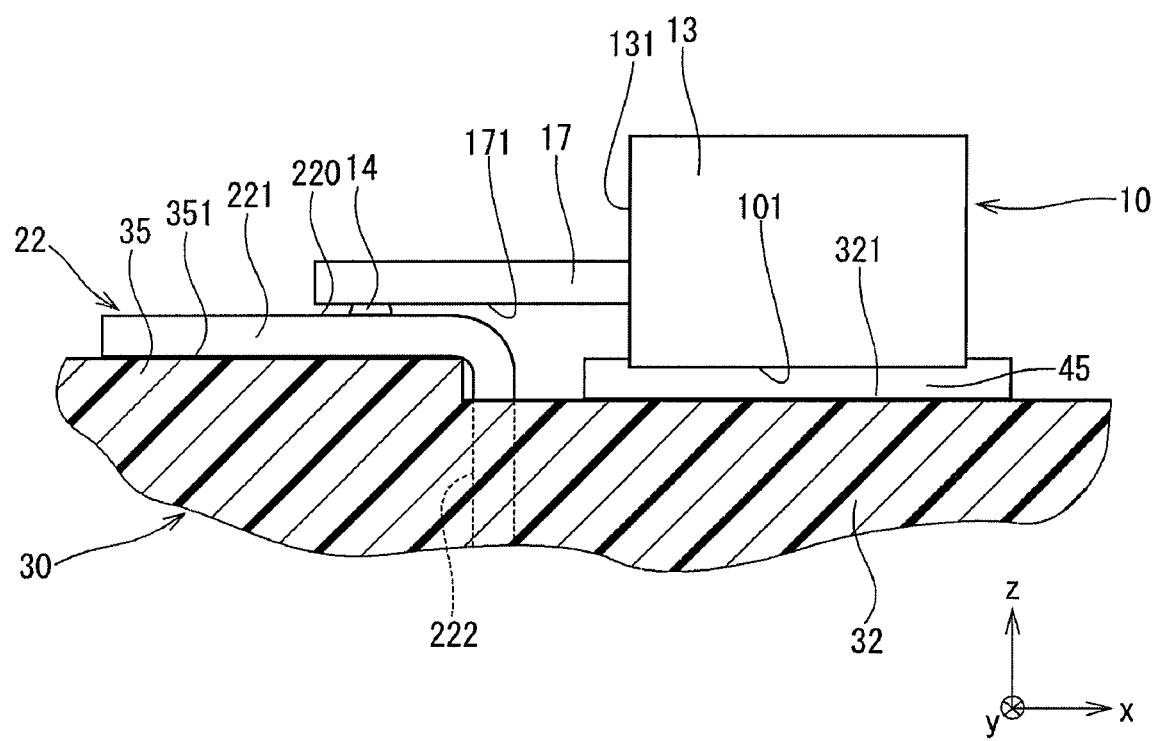
FIG. 4 is a partially enlarged view of a position detection device according to a second embodiment of the present disclosure.

FIG. 4 is a partially enlarged view of the rotation angle detection device according to the second embodiment. The rotation angle detection device according to the second embodiment includes an IC package 10, a sensor terminal 20, a motor terminal 25, a sensor housing 30, and a vibration reduction member 45.

The vibration reduction member 45 is made of a deformable elastic material, for example, a potting material. The vibration reduction member 45 is provided on a package installation surface 321. The vibration reduction member 45 is in contact with an opposing surface 101 of the IC package 10.

In the rotation angle detection device according to the second embodiment, the vibration reduction member 45 is provided so as to fill a gap provided between the package installation surface 321 and the opposing surface 101 when the multiple lead lines 16, 17, 18, 19 and the multiple terminal lines 21, 22, 23, 24 are fixed to each other by welding.

As a result, the vibration of the IC package 10, which may vibrate in the z-axis direction due to the gap provided between the package installation surface 321 and the opposing surface 101, can be reduced. Therefore, in the second embodiment, the effects of the first embodiment can be obtained, and a stress caused by the vibration can be prevented from acting on the IC package 10, so that the breakage of the IC package 10 can be reliably prevented.

Third Embodiment

A position detection device according to a third embodiment will be described with reference to FIGS. 5A and 5B. The third embodiment is different from the second embodiment in that a regulation member for regulating the movement of an IC package is provided.

Figure 5A:
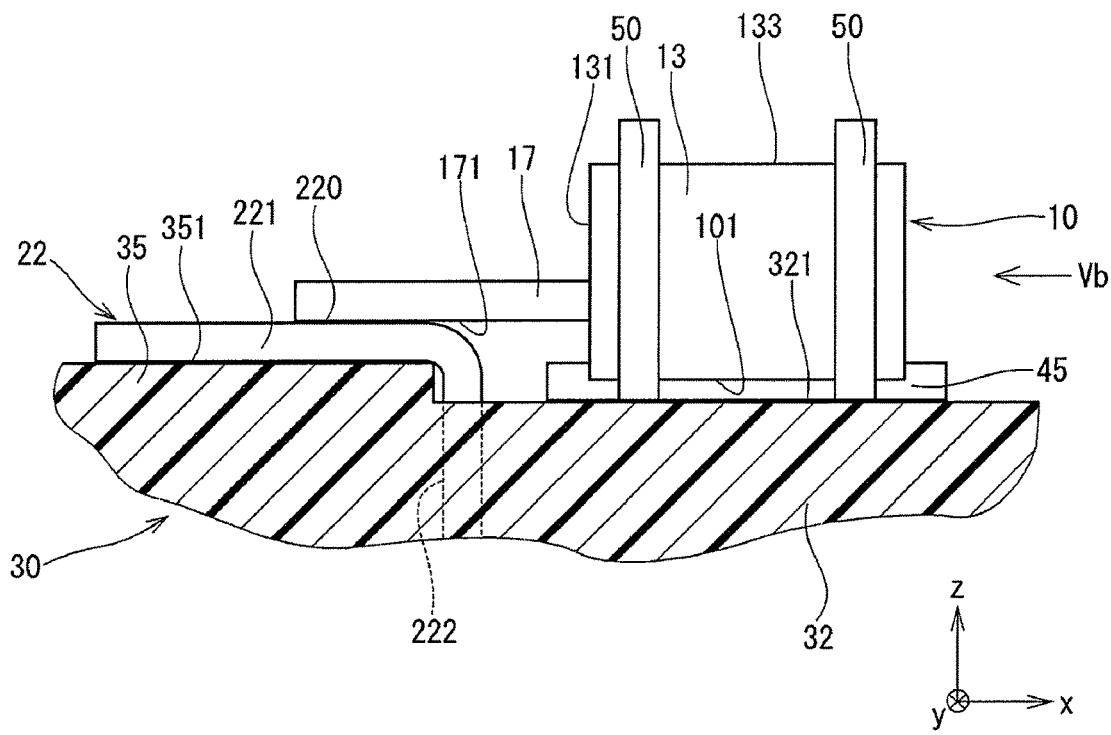
FIG. 5A is a partially enlarged view of a position detection device according to a third embodiment of the present disclosure.
Figure 5B:
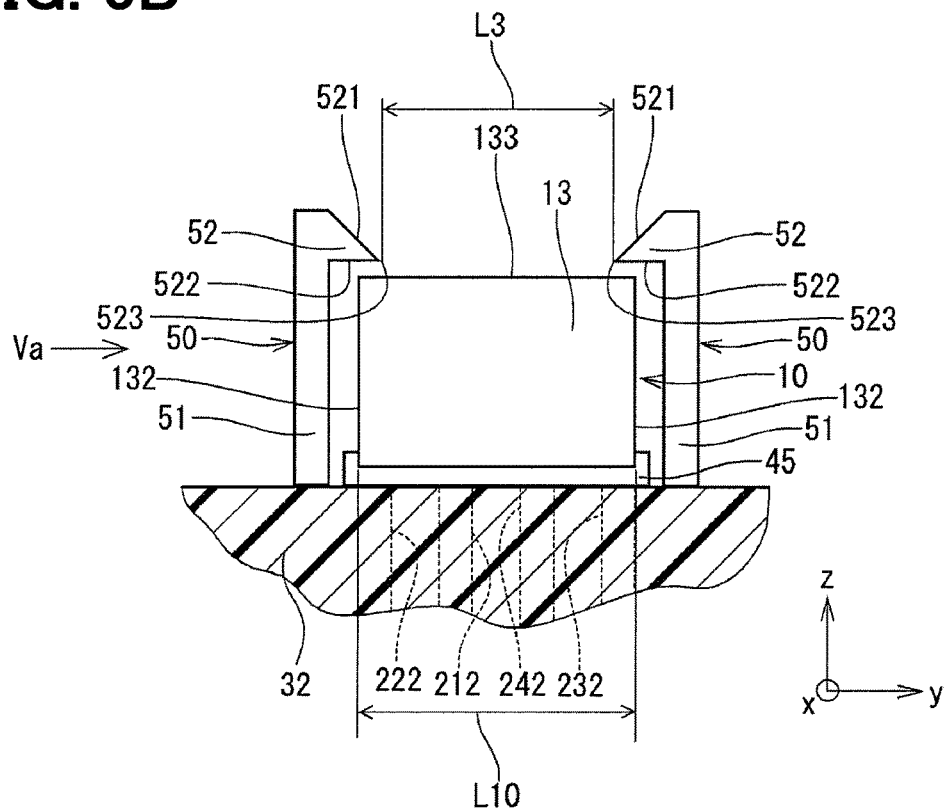
FIG. 5B is a view taken along an arrow Vb in FIG. 5A.

FIGS. 5A and 5B are partially enlarged views of the rotation angle detection device according to the third embodiment. The rotation angle detection device according to the third embodiment includes an IC package 10, a sensor terminal 20, a motor terminal 25, a sensor housing 30, a vibration reduction member 45, and multiple regulation members 50.

The regulation member 50 is provided on a package installation surface 321. In the third embodiment, two regulation members 50 are provided on a negative direction side of the y-axis of the IC package 10, and two regulation members 50 are provided on the positive direction side of the y-axis of the IC package 10. Each of the regulation members 50 has a column portion 51 and a claw portion 52. The column portion 51 and the claw portion 52 are integrally made of an elastic material.

As shown in FIG. 5B, the column portion 51 is formed so as to extend from a package installation surface 321 along a side surface 132 of a sealing portion 13 in a positive direction of a z-axis. The claw portion 52 is provided at an end portion of the column portion 51 opposite to the package installation surface 321.

The claw portion 52 is an end portion of the column portion 51 on the opposite side to the package installation surface 321, and is provided so as to project from the column portion 51 toward the IC package 10. An end face 521 of the claw portion 52 on the opposite side to the IC package 10 is inclined so as to approach the package installation surface 321 as the end face 521 approaches the IC package 10 provided on the package installation surface 321. An end face 522 of the claw portion 52 on the IC package 10 side is formed in a substantially planar shape so as to be substantially parallel to an upper surface 133 of the IC package 10.

As shown in FIG. 5B, the claw portion 52 is formed so that a distance L3 between a point on an intersection line 523 between one end face 521 and the other end face 522 of one claw portion 52 and a point on the intersection line 523 between an end face 521 and an end face 522 of the other claw portion 52 facing the one claw portion 52 across the IC package 10 is shorter than a length L10 of the IC package 10 in the y-axis direction.

In the rotation angle detection device according to the third embodiment, the movement in the positive direction of the z-axis as the "direction opposite to the package installation surface" is regulated by the claw portion 52 provided on the opposite side of the package installation surface 321 as viewed from the IC package 10. As a result, the IC package 10 can be prevented from rising in the positive direction of the z-axis by a linear expansion of the vibration reduction member 45, and a stress of peeling off the weld between the lead line and the terminal line or bending the lead line can be prevented from increasing. Therefore, in the third embodiment, the same effects as those in the second embodiment can be achieved, and the stress in the positive direction of the z-axis can be reduced, so that breakage of the IC package 10 can be reliably prevented.

The end face 521 of the claw portion 52 is inclined so as to approach the package installation surface 321 as the end face 521 approaches the center of the IC package 10. As a result, when the IC package 10 is assembled to the package installation surface 321 from the positive direction of the z-axis, if the IC package 10 moving from the positive direction of the z-axis comes into contact with the end face 521, an interval between the facing regulation members 50 is widened, and the IC package 10 can be provided between the end face 522 and the package installation surface 321. Therefore, the IC package 10 can be easily assembled to the package installation surface 321.

Other Embodiments

In the embodiments described above, the position detection device is applied to the electronically controlled throttle device for controlling the air intake amount to the engine mounted on the vehicle. However, a field to which the position detection device is applied is not limited to the above configuration.

In the embodiments described above, the lead line and the terminal line are fixed to each other by welding. However, the method of fixing the lead line and the terminal line in the relatively immovable manner is not limited to the above configuration. The lead line and the terminal line may be joined together by solder or by a conductive adhesive. In addition, the welding method may be resistance welding or laser welding.

In the embodiments described above, as shown in FIG. 2, the sensor terminal is formed so that one end portion of the sensor terminal connected to the lead line and the other end portion positioned at the connector portion are positioned substantially parallel to each other. However, the shape of the sensor terminal is not limited to the above configuration.

In the embodiments described above, the position detection device includes a motor terminal capable of supplying the electric power to the motor. However, there may be no motor terminal.

In the embodiments described above, the IC package is of a two-system output type having two magnetic detection elements. Alternatively, the IC package may have one magnetic detection element or three or more magnetic detection elements.

In the embodiments described above, the IC package includes the first signal processing circuit and the second signal processing circuit. Alternatively, the IC package may not include the first signal processing circuit and the second signal processing circuit. In the IC package, the first magnetic detection element and the first signal processing circuit, or the second magnetic detection element and the second signal processing circuit are provided separately. The first magnetic detection element and the first signal processing circuit, or the second magnetic detection element and the second signal processing circuit may be integrated together.

The magnetic detection element in the embodiments described above may output a signal corresponding to a component of a magnetic field such as a Hall element or an MR element or the intensity of the component.

The present disclosure described above is not limited to the foregoing embodiments and may be implemented in various forms within the scope not departing from the gist of the present disclosure.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

Optional aspects of the present disclosure will be set forth in the following clauses.

According to an aspect of the present disclosure, a position detection device for detecting a position of a detection target includes an IC package, a terminal line and a sensor housing.

The IC package includes a magnetic detection element configured to output a signal corresponding to a direction or intensity of a surrounding magnetic field, a sealing portion sealing the magnetic detection element, and a lead line protruding from the sealing portion and electrically connected to the magnetic detection element. The lead line is fixed to the terminal line. The sensor housing is formed separately from the IC package and supports the terminal line.

In the position detection device according to the aspect of the present disclosure, a distance from a package installation surface of the sensor housing on which the IC package is provided to an end face of the terminal line to be in contact with the lead line is larger than a distance from an end face of the lead line to be in contact with the terminal line to an opposing surface of the IC package facing the package installation surface.

In the position detection device according to the aspect of the present disclosure, the distance from the package installation surface of the sensor housing to the end face of the terminal line to be in contact with the lead line is larger than the distance from the end face of the lead line to be in contact with the terminal line to the opposing surface that faces the package installation surface of the IC package.

As a result, a gap is provided between the package installation surface and the opposing surface when the end face of the lead line to be in contact with the terminal line and the end face of the terminal line to be in contact with the lead line are in contact with each other, and the lead line and the terminal line can be fixed to each other so as not to be able to move relative to each other without deforming the lead line. Therefore, since the load is not applied to the IC package by the deformation of the lead line, the IC package can be prevented from being damaged.

What is claimed is:

1. A position detection device for detecting a position of a detection target, the position detection device comprising:
   an IC package that includes a magnetic detection element configured to output a signal corresponding to a direction or intensity of a surrounding magnetic field, a sealing portion sealing the magnetic detection element, and a lead line protruding from the sealing portion in an x-axis direction perpendicular to a Z-axis direction and electrically connected to the magnetic detection element;
   a terminal line to which the lead line is fixed; and
   a sensor housing that is formed separately from the IC package, has an opening and supports the terminal line, wherein
   the sensor housing has a mounting surface and a package installation surface defining the opening, the package installation surface and the mounting surface are flat surfaces substantially parallel to the x-axis direction;
   the terminal line includes an insertion portion and a connection terminal portion, the insertion portion is disposed inside the sensor housing, the connection terminal portion extends from the insertion portion, protrudes from the package installation surface to the opening of the sensor housing, and extends along the mounting surface of the sensor housing, the connection terminal portion has a terminal end face exposed on opposite side to the mounting surface in the z-axis direction;
   the sealing portion of the IC package is disposed in the opening of the sensor housing and has an opposing surface facing the package installation surface in the z-axis direction and being spaced apart from the package installation surface in the z-axis direciton;
   the lead line has a lead end face being exposed from the sealing portion and being in contact with the terminal end face of the connection terminal portion in the z-axis direction on opposite side to the mounting surface with respect to the connection terminal portion;
   a first distance is a distance in the z-axis direction and is from the package installation surface of the sensor housing to the terminal end face of the connection terminal portion of the terminal line;
   a second distance is a distance in the z-axis direction and is from the lead end face of the lead line to the opposing surface of the IC package;
   the first distance is larger than the second distance; and
   the position detection device further comprises: a vibration reduction member that is made of a potting material, and that is provided on the package installation surface and is in contact with the opposing surface of the IC package.

2. The position detection device according to claim 1, further comprising
   a regulation member that is configured to regulate movement of the IC package in a direction away from the package installation surface.

3. The position detection device according to claim 2, wherein
   an end face of the regulation member opposite to the IC package approaches the package installation surface as the end face of the regulation member approaches the IC package provided on the package installation surface.

4. The position detection device according to claim 2, wherein:
   the regulation member has a claw portion; and
   the claw portion includes an inclined surface that is neither perpendicular nor parallel to the package installation surface.

5. The position detection device according to claim 1, wherein:
   in the x-axis direction in which the lead line protrudes from the sealing portion of the IC package, the package installation surface of the sensor housing facing and spaced apart from the opposing surface of the IC package is larger in dimension than the opposing surface of the IC package.

6. A position detection device for detecting a position of a detection target based on a magnetic filed, comprising:
   an IC package that includes
      a magnetic detection element configured to output a signal according to the magnetic field,
      a sealing portion sealing the magnetic detection element and having a first opposing surface including a flat surface portion at least at a part, and
      a lead line protruding from the sealing portion in a protruding direction substantially parallel to the flat surface portion of the first opposing surface;
   a sensor housing that supports the IC package, and has a second opposing surface including a flat surface portion at least at a part; and
   a terminal line including an insertion portion disposed inside the sensor housing, and a protruding terminal extending from the insertion portion and protruding from the second opposing surface of the sensor housing and connected to the lead line,
   wherein:
   the first opposing surface of the sealing portion and the second opposing surface of the sensor housing are positioned facing each other at the flat surface portions thereof in an arrangement direction perpendicular to the protruding direction, and are spaced apart from each other in the arrangement direction of the first opposing surface and the second opposing surface;
   in the arrangement direction, the first opposing surface of the sealing portion is between the lead line and the second opposing surface of the sensor housing;
   the lead line extends along the second opposing surface of the sensor housing;
   in the arrangement direction, the protruding terminal is, at least in part, closer to the first opposing surface of the sealing portion than the second opposing surface of the sensor housing;
   the sensor housing supports the sealing portion via the lead line and the protruding terminal;
   the protruding terminal includes a terminal-side connection portion at which the protruding terminal is connected to the lead line in the arrangement direction;
   the lead line includes a lead-line-side connection portion at which the lead line is connected to the protruding terminal in the arrangement direction;
   in the arrangement direction, a distance between the terminal-side connection portion and the second opposing surface of the sensor housing is larger than a distance between the lead-line-side connection portion and the first opposing surface of the sealing portion, and the position detection device further comprises: a vibration reduction member that is made of a potting material, and that is provided on the second opposing surface of the sensor housing and contacts with the first opposing surface of the sealing portion of the IC package.

7. The position detection device according to claim 6, wherein:
in the arrangement direction, a surface of the protruding terminal, which surface includes the terminal-side connection portion, is arranged to face in a direction away from the second opposing surface of the sensor housing; and
in the arrangement direction, a surface of the lead line, which surface includes the lead-line-side connection portion, is arranged to face the second opposing surface of the sensor housing.

8. The position detection device according to claim 6, wherein:
the protruding terminal includes a portion at which the protruding terminal protrudes from the sensor housing; and
a position of the portion at which the protruding terminal protrudes from the sensor housing is between the second opposing surface of the sensor housing and the lead line.

9. The position detection device according to claim 6, wherein:
the protruding terminal is spaced apart from the sealing portion in the protruding direction such that the protruding terminal and the lead line are on the same side of the sealing portion in the protruding direction.

10. The position detection device according to claim 6, further comprising
a regulation member that is configured to regulate movement of the IC package in a direction away from the second opposing surface of the sensor housing.

11. The position detection device according to claim 10, wherein
an end face of the regulation member opposite to the IC package approaches the second opposing surface of the sensor housing as the end face of the regulation member approaches the IC package provided on the second opposing surface of the sensor housing.

12. The position detection device according to claim 10, wherein:
the regulation member has a claw portion; and
the claw portion includes an inclined surface that is neither perpendicular nor parallel to the second opposing surface of the sensor housing.

13. The position detection device according to claim 6, wherein:
in the protruding direction in which the lead line protrudes from the sealing portion of the IC package, the second opposing surface of the sensor housing facing and spaced apart from the first opposing surface of the sealing portion of the IC package is larger in dimension than the first opposing surface of the sealing portion of the IC package.

14. The position detection device according to claim 10, wherein:
the regulation member projects from the second opposing surface of the sensor housing in the arrangement direction and has a hook portion at an end opposite to the second opposing surface to regulate the movement of the IC package.

15. A position detection device for detecting a position of a detection target, the position detection device comprising:
an IC package that includes a magnetic detection element configured to output a signal corresponding to a direction or intensity of a surrounding magnetic field, a sealing portion sealing the magnetic detection element, and a lead line protruding from the sealing portion in x-axis direction perpendicular to a Z-axis direction and electrically connected to the magnetic detection element;
a terminal line to which the lead line is fixed; and
a sensor housing that is formed separately from the IC package and supports the terminal line, wherein:
the sensor housing has a mounting surface and a package installation surface defining an opening of the sensor housing, the mounting surface and the package installation surface are flat surfaces substantially parallel to the x-axis direction;
the terminal line includes an insertion portion and a connection terminal portion, the insertion portion is disposed inside the sensor housing, the connection terminal portion extends from the insertion portion, protrudes from the package installation surface to the opening of the sensor housing, and extends along the mounting surface of the sensor housing, the connection terminal portion has a terminal end face exposed on opposite side to the mounting surface in the z-axis direction;
the sealing portion of the IC package is disposed in the opening of the sensor housing and has a opposing surface facing the package installation surface in the z-axis direction and being spaced apart from the package installation surface in the z-axis direction;
the lead line has a lead end face being exposed from the scaling portion and being connected to the terminal end face of the connection terminal portion in the z-axis direction on opposite side to the mounting surface with respect to the connection terminal portion;
a first distance is a distance in the z-axis direction and is from the package installation surface of the sensor housing to the terminal end face of the connection terminal portion of the terminal line;
a second distance is a distance in the z-axis direction and from the lead end face of the lead line to the opposing surface of the IC package;
the first distance is larger than the second distance, and
the position detection device further comprises: a vibration reduction member that is made of a potting material, and that is provided on the package installation surface and is in contact with the opposing surface of the IC package.

16. The position detection device according to claim 15, wherein:
a projection is provided on the terminal end face of the terminal line; and
the terminal end face of the terminal line and the lead end face of the lead line are connected to each other via the projection.

17. The position detection device according to claim 15, wherein:
the lead end face of the lead line and the terminal end face of the terminal line are connected to each other by welding.

18. The position detection device according to claim 15, further comprising
a regulation member that has a claw portion that is configured to regulate movement of the IC package in a direction away from the package installation surface, wherein
the claw portion includes an inclined surface that is neither perpendicular nor parallel to the second opposing surface of the sensor housing.

19. The position detection device according to claim 15, wherein:
in the x-axis direction in which the lead line protrudes from the sealing portion of the IC package, the package installation surface of the sensor housing facing and spaced apart from the opposing surface of the IC package is larger in dimension than the opposing surface of the IC package.

20. The position detection device according to claim 15, further comprising
a regulation member that projects from the package installation surface and has a hook portion at an end opposite to the package installation surface in the z-axis direction to regulate movement of the IC package in a direction away from the package installation surface.

21. A position detection device for detecting a position of a detection target, the position detection device comprising:
an IC package that includes a magnetic detection element configured to output a signal corresponding to a direction or intensity of a surrounding magnetic field, a sealing portion sealing the magnetic detection element, and a lead line protruding from the sealing portion in an x-axis direction perpendicular to a Z-axis direction and electrically connected to the magnetic detection element;
a terminal line to which the lead line is fixed; and
a sensor housing that is formed separately from the IC package and supports the terminal line, wherein:
the sensor housing has a mounting surface and a package installation surface defining an opening of the sensor housing, the mounting surface and the package installation surface are flat surfaces substantially parallel to the x-axis direction;
the terminal line includes an insertion portion and a connection terminal portion, the insertion portion is disposed inside the sensor housing, the connection terminal portion extends from the insertion portion, protrudes from the package installation surface to the opening of the sensor housing, and extends along the mounting surface of the sensor housing, the connection terminal portion has a terminal end face exposed on opposite side to the mounting surface in the z-axis direction;
the sealing portion of the IC package is disposed in the opening of the sensor housing and has an opposing surface facing the package installation surface in the z-axis direction and being spaced apart from the package installation surface in the z-axis direction;
the lead line has a lead end face being exposed from the sealing portion and being connected to the terminal end face of the connection terminal portion in the z-axis direction on opposite side to the mounting surface with respect to the connection terminal portion;
a first distance is a distance in the z-axis direction and is from the package installation surface of the sensor housing to the terminal end face of the connection terminal portion of the terminal line;
a second distance is a distance in the z-axis direction and from the lead end face of the lead line to the opposing surface of the IC package;
the first distance is larger than the second distance, and the position detection device further comprises: a vibration reduction member that is made of a potting material, and that is provided on the package installation surface and is in contact with the opposing surface of the IC package;
the regulation member that has a claw portion that is configured to regulate movement of the IC package in a direction away from the package installation surface, wherein
the claw portion includes an inclined surface that is neither perpendicular nor parallel to a top surface of the IC package.

* * * * *